US010996555B2

United States Patent
Ji et al.

(10) Patent No.: US 10,996,555 B2
(45) Date of Patent: May 4, 2021

(54) MASK FRAME ASSEMBLY INCLUDING BOTH FRAME AND MASK PLATE FIXED ON FRAME, AND EVAPORATION APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Fengli Ji, Beijing (CN); Shanshan Bai, Beijing (CN); Yinan Liang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 16/815,865

(22) Filed: Mar. 11, 2020

(65) Prior Publication Data

US 2020/0209735 A1  Jul. 2, 2020

Related U.S. Application Data

(62) Division of application No. 15/737,220, filed as application No. PCT/CN2017/084112 on May 12, 2017, now Pat. No. 10,627,714.

(30) Foreign Application Priority Data

May 13, 2016 (CN) .......................... 201610320002.8

(51) Int. Cl.
*G03F 1/42* (2012.01)
*C23C 14/04* (2006.01)
(Continued)

(52) U.S. Cl.
CPC ................ *G03F 1/42* (2013.01); *B05B 12/20* (2018.02); *B05C 17/06* (2013.01); *B05C 17/08* (2013.01);
(Continued)

(58) Field of Classification Search
CPC ........................... H01L 21/682; C23C 14/042
See application file for complete search history.

(56) References Cited

U.S. PATENT DOCUMENTS 4,338,620 A * 7/1982 Kawabe .................. H01L 21/32
257/520
4,599,970 A  7/1986 Peterson
(Continued)

FOREIGN PATENT DOCUMENTS

CN  101965634 A  2/2011
CN  103205670 A  7/2013
(Continued)

OTHER PUBLICATIONS

International Preliminary Report on Patentability received for PCT Patent Application No. PCT/CN2017/084112, dated Nov. 22, 2018, 16 pages (10 pages of English Translation and 6 pages of Original Document).
(Continued)

*Primary Examiner* — Karl Kurple
(74) *Attorney, Agent, or Firm* — Womble Bond Dickinson (US) LLP

(57) ABSTRACT

A mask frame assembly and an evaporation apparatus are disclosed. The mask frame assembly comprises a frame and a mask plate fixed on the frame. The mask frame assembly is provided with alignment marks, which comprise a first alignment hole arranged in the frame and a second alignment hole arranged in the mask plate. The first alignment hole is a through hole. The mask frame assembly effectively
(Continued)

solves a problem in which liquid residuals in alignment holes of the frame interfere with alignment.

7 Claims, 3 Drawing Sheets

(51) Int. Cl.
| | |
|---|---|
| G03F 1/64 | (2012.01) |
| B05C 17/06 | (2006.01) |
| B05C 17/08 | (2006.01) |
| B05B 12/20 | (2018.01) |
| H01L 21/308 | (2006.01) |
| G03F 1/66 | (2012.01) |
| G03F 1/68 | (2012.01) |
| H01L 51/56 | (2006.01) |
| C23C 16/04 | (2006.01) |
| B05D 1/32 | (2006.01) |
| H01L 51/00 | (2006.01) |

(52) U.S. Cl.
CPC ............. *C23C 14/042* (2013.01); *G03F 1/64* (2013.01); *G03F 1/66* (2013.01); *G03F 1/68* (2013.01); *H01L 21/308* (2013.01); *H01L 51/56* (2013.01); *B05D 1/32* (2013.01); *C23C 16/042* (2013.01); *H01L 51/0011* (2013.01)

(56) References Cited

U.S. PATENT DOCUMENTS

| | | | |
|---|---|---|---|
| 4,915,057 A * | 4/1990 | Boudreau | C23C 14/042 118/505 |
| 5,401,691 A | 3/1995 | Caldwell | |
| 5,847,813 A | 12/1998 | Hirayanagi | |
| 6,003,828 A * | 12/1999 | Kawahashi | G03F 7/2002 248/576 |
| 6,146,969 A | 11/2000 | Tan et al. | |
| 7,918,705 B2 | 4/2011 | Lee et al. | |
| 9,601,436 B2 | 3/2017 | Lai et al. | |
| 2002/0111035 A1 * | 8/2002 | Atobe | C23C 14/042 438/753 |
| 2003/0098124 A1 * | 5/2003 | Clark | C23C 14/042 156/751 |
| 2003/0108805 A1 * | 6/2003 | Clark | H01L 51/0011 430/22 |
| 2006/0068304 A1 | 3/2006 | Iriguchi | |
| 2007/0072337 A1 * | 3/2007 | Matsuzaki | H01L 51/0011 438/99 |
| 2008/0118743 A1 * | 5/2008 | Lee | H01L 51/56 428/332 |
| 2009/0079452 A1 * | 3/2009 | Eldridge | G11C 29/56 324/756.03 |
| 2011/0033726 A1 | 2/2011 | Jorda Sanuy et al. | |
| 2013/0008379 A1 | 1/2013 | Chang et al. | |
| 2014/0162385 A1 | 6/2014 | Huh et al. | |
| 2014/0217646 A1 | 8/2014 | Lee et al. | |
| 2015/0068023 A1 | 3/2015 | Han | |
| 2015/0246416 A1 | 9/2015 | Mizumura | |
| 2015/0357287 A1 | 12/2015 | Lai et al. | |
| 2016/0263607 A1 | 9/2016 | Wang et al. | |
| 2016/0281208 A1 | 9/2016 | Zhang | |
| 2016/0372715 A1 | 12/2016 | Seo et al. | |
| 2018/0202034 A1 * | 7/2018 | Lin | B05C 21/005 |
| 2018/0209029 A1 | 7/2018 | Lin et al. | |
| 2018/0312957 A1 | 11/2018 | Zhang | |
| 2019/0044068 A1 | 2/2019 | Jiang et al. | |

FOREIGN PATENT DOCUMENTS

| | | |
|---|---|---|
| CN | 103866230 A | 6/2014 |
| CN | 103966546 A | 8/2014 |
| CN | 204434718 U | 7/2015 |
| CN | 105274471 A | 1/2016 |
| CN | 105887010 A | 8/2016 |

OTHER PUBLICATIONS

International Search Report received for PCT Patent Application No. PCT/CN2017/084112, dated Aug. 11, 2017, 6 pages (2 pages of English Translation and 4 pages of Original Document).
Office Action received for Chinese Patent Application No. 201610320002.8, dated Dec. 21, 2017, 10 pages (4 pages of English Translation and 6 pages of Office Action).
Written Opinion received for PCT Patent Application No. PCT/CN2017/084112, dated Aug. 11, 2017, 13 pages (8 pages of English Translation and 5 pages of Original Document).

* cited by examiner

US 10,996,555 B2

MASK FRAME ASSEMBLY INCLUDING BOTH FRAME AND MASK PLATE FIXED ON FRAME, AND EVAPORATION APPARATUS

RELATED APPLICATIONS

The present application is the U.S. national phase entry of PCT/CN2017/084112, with an international filing date of May 12, 2017, which claims the benefit of Chinese Patent Application No. 201610320002.8, filed on May 13, 2016, the entire disclosures of which are incorporated herein by reference.

TECHNICAL FIELD

The present disclosure relates to the display field, and particularly to a mask frame assembly and an evaporation apparatus.

BACKGROUND

Due to the advantages of self emission, quick response, high brightness, light and thin, an OLED (Organic Light Emitting Diode) display panel has become the mainstream produce in the display field.

The OLED display panel comprises sub-pixel units which are arranged in an array. Each sub-pixel unit comprises an anode, a light emitting layer, and a cathode. The light emitting layer is made from an organic electroluminecent light emitting material form. Currently, the light emitting layer is formed in each sub-pixel unit in an evaporation process with a mask plate. During the evaporation process, the mask plate must be soldered onto the frame so as to be used in the evaporation apparatus. The mask plate and the frame which have been soldered together are referred to as a MFA (mask frame assembly). The alignment mask is prone to introduce liquid residuals during use. The liquid residuals adversely affect the alignment process, and even cause failure in alignment. Thus, it is urgent to solve the problem in which liquid residuals affect the alignment process.

SUMMARY

It is an object of the present disclosure to alleviate or eliminate one or more of the above problems.

Embodiments of the present disclosure provide a mask frame assembly, comprising a frame and a mask plate fixed on the frame, wherein the mask frame assembly is provided with alignment marks, and the alignment marks comprise a first alignment hole which is arranged in the frame and a second alignment hole which is arranged in the mask plate, and wherein the first alignment hole is a through hole, or wherein the first alignment hole is a blind hole, the deepest position at a bottom of the blind hole does not overlap with an orthographic projection of the second alignment hole on the frame.

For example, the first alignment hole comprises a first segment, and the first segment has an inner wall which is not perpendicular with a plane in which the mask plate lies.

For example, when the first alignment hole is a blind hole, the first segment has a cone shape, and the first segment has an axis which is perpendicular with the plane in which the mask plate lies.

For example, an orthographic projection of the second alignment hole on the frame is located on the inner wall of the first segment.

For example, the first segment has a cone angle about 60 degrees-150 degrees and a height about 1.5 mm-2.0 mm.

For example, the first alignment hole further comprises a second segment of a cylinder shape, and the second segment has an axis which is perpendicular with the plane in which the mask plate lies.

For example, the second segment has a height about 0.8 mm-1.2 mm.

For example, when the first alignment hole is a through hole, the first alignment hole further comprises a third segment which extends in a vertical direction from the first segment to the bottom of the frame.

For example, an intersection of the third segment and the first segment is not higher than a projection region of the second alignment hole on the inner wall of the first alignment hole.

For example, the third segment extends from the deepest position of a bottom of the first alignment hole to the bottom of the frame.

For example, when the first alignment hole is a through hole, the first segment has a cylinder shape, and the first segment has an axis which is not perpendicular with the plane in which the mask plate lies.

For example, an intersection angle between the axis of the first segment and the plane in which the mask plate lies is about 30 degrees-60 degrees.

For example, the first alignment hole further comprises a third segment which is arranged on at least one end of the first segment, the third segment has a cylinder shape, and the third segment has an axis which is perpendicular with the plane in which the mask plate lies.

For example, the second alignment hole is a through hole.

For example, the frame and the mask plate is made from a metallic material, and the mask plate is soldered to the frame.

For example, the mask frame assembly comprises four or more alignment marks.

The present disclosure further provides an evaporation apparatus, comprising the mask frame assembly as described above.

DETAILED DESCRIPTION OF EMBODIMENTS

Figure 1:
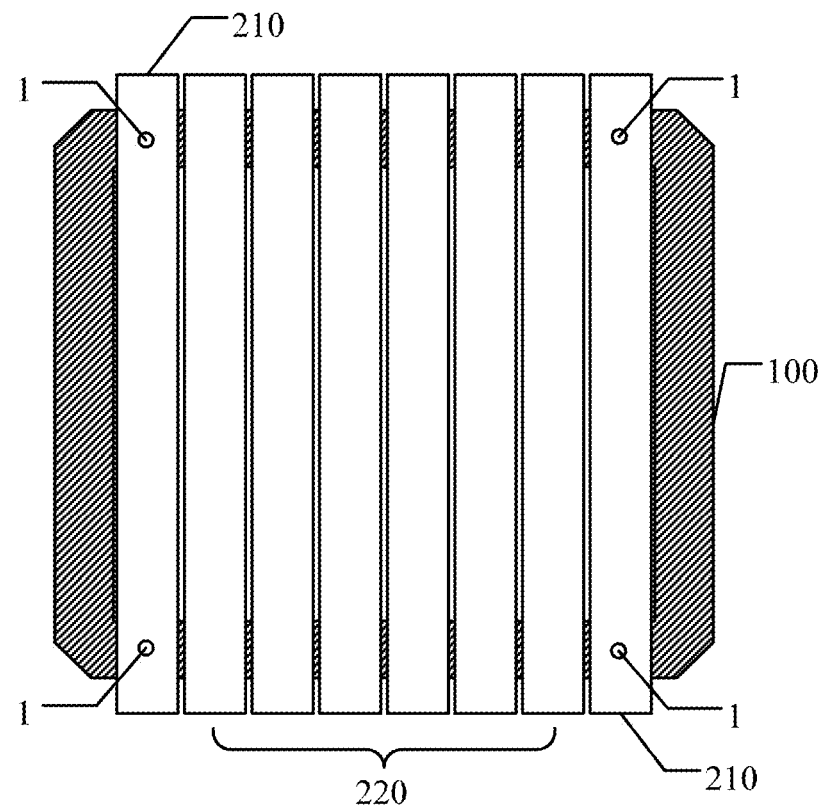
FIG. 1 is a schematic view for illustrating a mask frame assembly in an embodiment of the present disclosure.

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

Embodiments of the present disclosure provide a mask frame assembly, comprising a frame and a mask plate fixed on the frame, wherein the mask frame assembly is provided with alignment marks, and the alignment marks comprise a first alignment hole which is arranged in the frame and a second alignment hole which is arranged in the mask plate, and wherein the first alignment hole is a through hole, or wherein the first alignment hole is a blind hole, the deepest position at a bottom of the blind hole does not overlap with an orthographic projection of the second alignment hole on the frame.

In the context of the present disclosure, the expression "an orthographic projection on the frame" refers to a projection in a direction perpendicular with a surface of the frame.

In order to align the MFA with a TFT (Thin Film Transistor) base plate prior to evaporation, alignment marks are arranged at four corners of the MFA for this blew. In a design, conical bores are formed in four corners of the frame, respectively, and alignment holes are formed in the alignment mask at positions corresponding to the alignment marks. Generally, alignment holes in the alignment mask have centers which coincide with centers of conical bores in the underlying frame. During alignment, images are acquired by a CCD image sensor, edges of alignment holes in the alignment mask are recognized on basis of difference in gray scale, and then the alignment between MFA and the TFT base plate is realized. However, after the mask plate of the MFA is cleaned, and even after the mask plate is blew with an air knife, a liquid (a solution or water) may still remain in conical bores of the frame. In this case, the liquid stays at the deepest position in the conical bores under the force of gravity, and forms spots at this position after evaporation. During alignment, since the spots coincide with centers of the alignment holes, edges of alignment holes in the alignment mask can not be recognized in the image acquired by the image sensor. This causes failure in fetching the alignment mask, and the evaporation apparatus generate an alarm signal.

In an embodiment of the present disclosure, a mask frame assembly is provided which effectively alleviates or solves the problem in which liquid residuals in alignment holes of the frame interfere with alignment.

For example, in the mask frame assembly according to an embodiment of the present disclosure, the first alignment hole comprises a first segment, and the first segment has an inner wall which is not perpendicular with the plane in which the mask plate lies. An orthographic projection of the second alignment hole on the frame is located on the inner wall of the first segment.

Reference is made to FIG. 1, which is a schematic view for a mask frame assembly in an embodiment of the present disclosure. The mask frame assembly comprises a frame 100 and mask plates 210, 220 which are arranged on the frame 100. The mask plates 210, 220 comprise a mask plate 210 (i.e., an alignment mask) which is provided with alignment holes and several mask plates 220 which are not provided with alignment holes. The mask frame assembly is provided with alignment marks 1. The alignment marks 1 comprise a first alignment hole 101 which is arranged in the frame 100 and a second alignment hole 211 which is arranged in the mask plate 210. The second alignment hole 211 in the mask plate 210 is a through hole.

Figure 2:
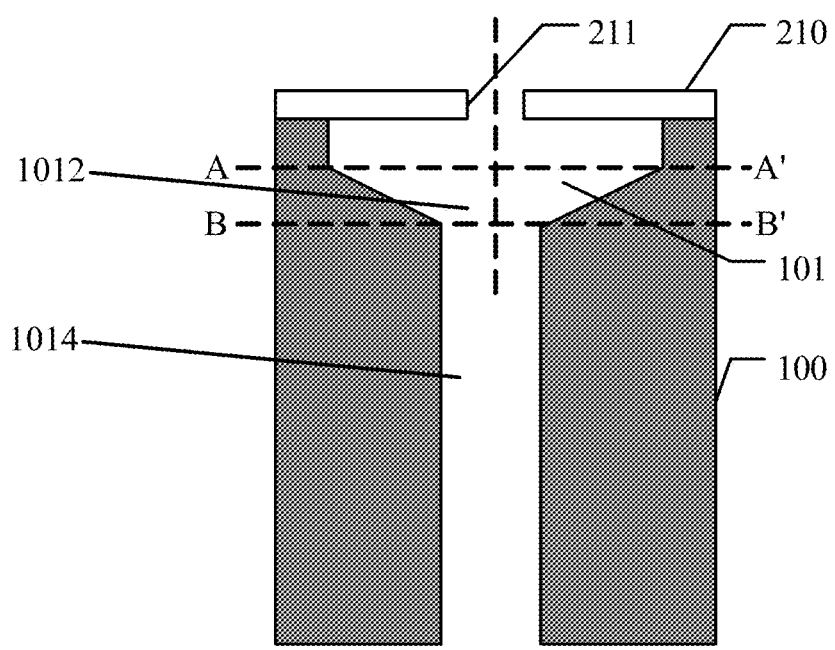
FIG. 2 is a schematic view for illustrating alignment marks on a mask frame assembly in an embodiment of the present disclosure.

FIG. 2 schematically shows in a cross-sectional view alignment marks in a mask frame assembly in an embodiment of the present disclosure. The first alignment hole 101 comprises a first segment 1012 which has a truncated cone shape (a segment between a dotted line AN and a dotted line BB'), a second segment of a cylinder shape at a side of the first segment 1012 (a segment over the dotted line AN), and a third segment 1014 of a cylinder shape at the other side of the first segment 1012 (a segment below the dotted line BB'). Generally, the first alignment hole 101 is a through hole which penetrates the frame 100. In this embodiment, the third segment 1014 extends from the deepest position in the bottom of the first alignment hole 101 to the bottom of the frame 100. In this case, after the mask plate 210 is cleaned, liquid on the frame 100 is discharged through the third segment. This avoids liquid residuals in the first alignment hole 101. Spots due to liquid residuals would not be formed at a position right below the second alignment hole 211, so that the second alignment hole 211 is efficiently recognized during alignment.

In the embodiment of FIG. 2, the second alignment hole 211 is arranged at a central position of the mask plate 210, and the third segment of the first alignment hole 101 overlaps with an orthographic projection of the second alignment hole 211 on the frame 100. However the present disclosure is not limited to this, in principle an intersection of the third segment and the first segment can be arranged at any position in first alignment hole. In particular, in case the first alignment hole 101 is a through hole, during blowing with the air knife after cleaning the mask plate 210, the liquid is more easily discharged from the frame 100 through the through hole. This alleviates or avoids spots formed in the first alignment hole 101. Thus, by adopting the first alignment hole 101 in the form of a through hole, it is expected to decrease the possibility of forming spots in the first alignment hole.

Figure 3A:
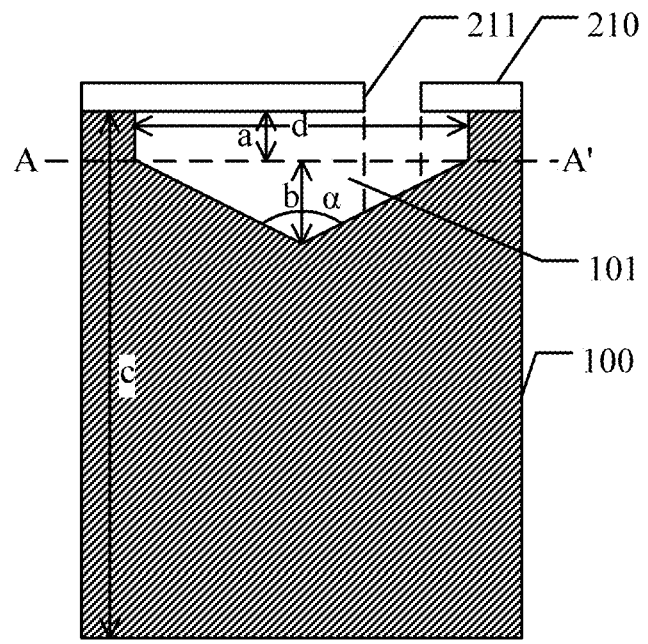
FIG. 3A is a schematic view for illustrating alignment marks on a mask frame assembly in an embodiment of the present disclosure.

FIG. 3A schematically shows in a cross-sectional view alignment marks of a mask frame assembly in an embodiment of the present disclosure. In this embodiment, the first alignment hole in the frame 100 is a blind hole. As shown in FIG. 3A, an orthographic projection of the second alignment hole 211 on the frame 100 is located on an inner wall of the first alignment hole 101. The deepest position in the bottom of the first alignment hole 101 is located outside the orthographic projection of the second alignment hole 211 on the frame 100. Namely, the deepest position in the bottom of the first alignment hole 101 is not located in the orthographic projection of the second alignment hole 211 on the frame 100.

Figure 3B:
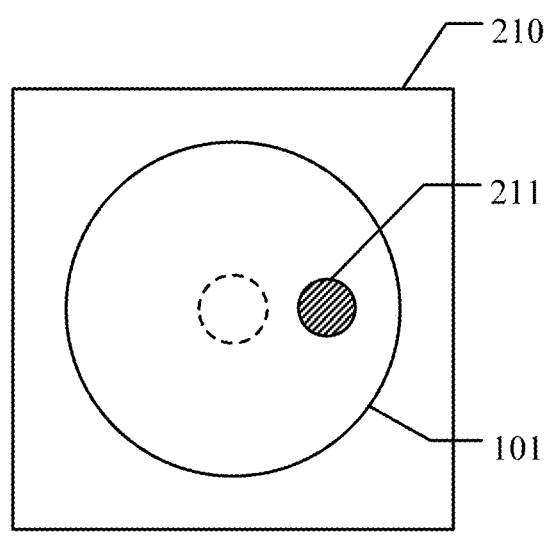
FIG. 3B is a top view for illustrating alignment marks in FIG. 3A.

As for the alignment marks 1 in FIG. 3A, the top view is shown in FIG. 3B. When there is a small amount of liquid residuals in the first alignment hole 101, the liquid residuals generally stay at the deepest position in the first alignment hole (i.e., in the dotted line region of FIG. 3B) under the force of gravity. During alignment, the evaporation apparatus can still effectively recognize alignment marks 1 on basis of difference in gray scale between the first alignment hole 101 and the mask plate 210 on the frame 100. This prevents liquid residuals from interfering with alignment.

As shown in FIG. 3B, the frame 100 has a thickness c for example about 20 mm-30 mm. For example, the thickness c is 15 mm. In the alignment marks 1 as described above, the opening of the first alignment hole 101 has a circular shape, or a polygonal (e.g., octagonal) shape. When the opening has a circular shape, the opening has a diameter d for example about 5 mm-7 mm. For example the diameter d is 6 mm. For example, as shown in FIG. 3A, the first alignment hole 101 in the frame 100 comprises a first segment of a cone shape (a segment below the dotted line AA') and a second segment of a cylinder shape (a segment over the dotted line AN). The orthographic projection of the second alignment hole 211 on the frame 100 is located on the inner wall of the first segment. During fabrication, the second segment is formed in the frame, and then the first segment is formed.

The first segment of the first alignment hole 101 has an axis perpendicular with the plane in which the mask plate 210 lies. The first segment has a cone angle α for example about 60 degrees-150 degrees. For example, the cone angle α is 90 degrees or 120 degrees. The first segment has a height b for example about 1.5 mm-2.0 mm. For example, the height b is 1.8 mm (millimeter). The first segment of FIG. 2 can be considered as a segment which is formed by truncating the first segment of FIG. 3B. Therefore, description about parameters apart from the height b is applicable to the first segment of FIG. 2.

The second segment of the first alignment hole 101 has an axis, which for example is also perpendicular with the plane in which the mask plate 210 lies. The second segment has a height a for example about 0.8 mm-1.2 mm. For example, the height a is 1.0 mm. As for the case in FIG. 2, the above description regarding the second segment of the first alignment hole 101 applies.

Figure 4:
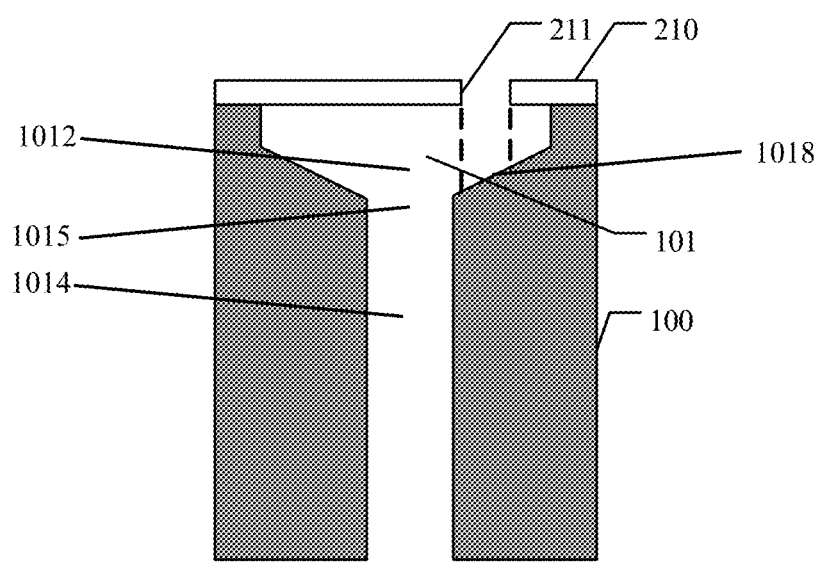
FIG. 4 is a schematic view for illustrating alignment marks on a mask frame assembly in an embodiment of the present disclosure.

FIG. 4 schematically shows in a cross-sectional view alignment marks in a mask frame assembly in an embodiment of the present disclosure. In this embodiment, the first alignment hole 101 comprises a third segment which extends from the deepest position in its bottom to the bottom of the frame 100, and the orthographic projection of the second alignment hole 211 on the frame 100 is located on the inner wall of the first alignment hole 101. In embodiments shown in FIG. 2 and FIG. 4, the third segment of the first alignment hole 101 extends in the thickness direction of the frame 100.

Reference is made to FIG. 3A and FIG. 4. As shown in FIG. 3A, since the orthographic projection of the second alignment hole 211 on the frame 100 is located at the inner wall of the first alignment hole 101, the deepest position in the bottom of the first alignment hole 101 generally is not located within the orthographic projection of the second alignment hole 211 on the frame 100. This prevents spots which otherwise would occur at the deepest position in the bottom of the first alignment hole 101 from affecting the alignment process. Thus, when the orthographic projection of the second alignment hole 211 is offset with respect to the deepest position in the bottom of the first alignment hole 101, the first alignment hole 101 in a form of a blind hole is generally sufficient to avoid spots from affecting alignment process. As can be seen from comparison between FIG. 3A and FIG. 4, when the second alignment hole is offset from the position where liquid residuals may potentially occur, the third segment of the first alignment hole 101 in FIG. 4 is necessary.

Reference is made to FIG. 2 and FIG. 4. As shown in FIG. 2, an intersection of the third segment 1014 and the first segment 1012 in the first alignment hole 101 is located at the deepest position in the bottom of the first alignment hole 101. This is sufficient to avoid liquid residuals, and further avoid spots from affecting alignment process. As can be seen from comparison between FIG. 2 and FIG. 4, when the first alignment hole is provided with the third segment at the deepest position in the bottom to form a through hole, soldering the liquid would not remain in the first alignment hole. Therefore, there is no limitation to the position where the second alignment hole 211 is arranged in the mask plate 210. Namely, it is not necessary for the orthographic projection of the second alignment hole 211 in FIG. 4 to offset from the third segment.

In the embodiment shown in FIG. 4, the intersection of the third segment 1014 and the first segment 1012 in the first alignment hole 101 is not necessarily located at the deepest position in the bottom of the first alignment hole 101. In other embodiments, the intersection 1015 of the third segment 1014 and the first segment 1012 in the first alignment hole 101 is arranged in the inclined inner wall of the first alignment hole 101, and it is advantageous that the intersection 1015 is not higher than a projection region 1018 of the second alignment hole 211 on the inner wall of the first alignment hole 101.

In the embodiments shown in FIG. 2 and FIG. 4, the first alignment hole 101 in the frame 100 is a through hole, so as to avoid liquid residuals in the first alignment hole 101, and thus avoid the liquid residuals from interfering with alignment process.

Figure 5:
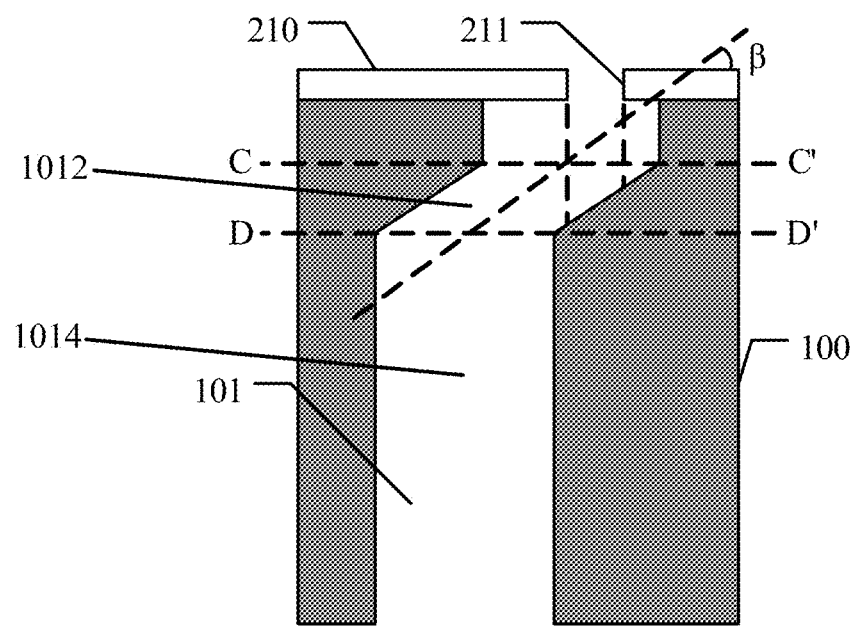
FIG. 5 is a schematic view for illustrating alignment marks on a mask frame assembly in an embodiment of the present disclosure.

FIG. 5 schematically shows in a cross-sectional view alignment marks in a mask frame assembly in an embodiment of the present disclosure. Similar with FIG. 2 and FIG. 4, both the second alignment hole 211 in the mask plate 210 and the first alignment hole 101 in the frame 100 are through holes. The first alignment hole 101 in the frame 100 comprises a first segment 1012 (a segment between a dotted line CC' and a dotted line DD'). The first segment 1012 has a cylinder shape. The first segment has an axis which is not perpendicular with the plane in which the mask plate 210 lies. The orthographic projection of the second alignment hole 211 on the frame 100 is located on the inner wall of the first segment, to ensure that the orthographic projection does not overlap with any spot. To this end, the evaporation apparatus can effectively recognize alignment marks on basis of difference in gray scale between the first alignment hole 101 and the mask plate 210 on the frame 100.

An intersection angle β between the axis of the first segment and the plane in which the mask plate lies is an angle other than 90 degrees. For example, the intersection angle β is about 30 degrees-60 degrees. For example, the intersection angle β is 50 degrees.

For example, as for the first alignment hole in the form of a through hole, in order to decrease the area of the frame which is occupied by the first alignment hole, the first alignment hole further comprises a third segment 1014 which is arranged on at least one end of the first segment 1012. The third segment has a cylinder shape. The third segment has an axis which is perpendicular with the plane in which the mask plate lies. For example, as shown in FIG. 5, two third segments are arranged at both the upper and lower ends (a portion above the dotted line CC' and a portion below the dotted line DD') of the first segment of the first alignment hole 101. During fabrication, the third segments are firstly formed at both sides of the frame, and then the first segment communicating with these two third segments is formed.

In the mask frame assembly according to embodiments of the present disclosure, the frame 100 and the mask plate 210 for example is made from a metallic material. Generally, the first alignment hole 101 of the types as described above is formed in the frame 100 by a machining process. By taking FIG. 5 as an example, during fabrication, third segments extending in the vertical direction are formed at both sides of the frame 100 by machining. Then, the first segment is formed so as to the first alignment hole 101 in the form of a through hole. Since the third segments are formed at two ends of the first segment, these third segments do not need to be long. From the view of machining process, the first alignment hole 101 of this construction is advantageous.

The mask plate 210 is fixed on the frame 100 by soldering.

For example, the mask frame assembly comprises a plurality of alignment marks as described above. For example, as shown in FIG. 1, in the mask plates 210 at the left-most and right-most side of the frame 100, the second alignment hole 211 is arranged at both the upper end and the lower end, so that four alignment marks 1 are formed at four corners of the mask frame assembly. It is noted that, the mask plates 210 which are provided with second alignment holes 211 is not necessarily arranged at the left-most and right-most side of the frame 100.

Moreover, embodiments of the present disclosure further provide an evaporation apparatus, comprising the mask frame assembly as described above.

In each of the above embodiments, description is made by referring to the first segment of the first alignment hole which has a cone shape or truncated cone shape. In practice, the present inventive concept is not limited to the first segment of this shape. For example, in the case of blind hole shown in FIG. 3A, the first segment may have a composite shape consisting of a truncated cone and a hemisphere.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A mask frame assembly comprising a frame and a mask plate fixed on the frame, wherein the mask frame assembly is provided with alignment marks, and the alignment marks comprise a first alignment hole which is arranged in the frame and a second alignment hole which is arranged in the mask plate;

wherein the first alignment hole is a through hole;

wherein the first alignment hole comprises a first segment, and the first segment has an inner wall which is not perpendicular with a plane in which the mask plate lies;

wherein the first segment is a cylinder, and the cylinder has an axis which is not perpendicular with the plane in which the mask plate lies; and wherein an intersection angle between the axis of the cylinder of the first segment and the plane in which the mask plate lies is 30 degrees-60 degrees.

2. The mask frame assembly of claim 1, wherein the first alignment hole further comprises a third segment which extends in a vertical direction from the first segment to the bottom of the frame.

3. The mask frame assembly of claim 2, wherein an intersection of the third segment and the first segment is not higher than a projection region of the second alignment hole on the inner wall of the first alignment hole.

4. The mask frame assembly of claim 2, wherein the third segment extends from the deepest position of a bottom of the first alignment hole to the bottom of the frame.

5. The mask frame assembly of claim 1, wherein the first alignment hole further comprises a third segment which is arranged on at least one end of the first segment, the third segment is a cylinder, and the cylinder of the third segment has an axis which is perpendicular with the plane in which the mask plate lies.

6. The mask frame assembly of claim 1, wherein the second alignment hole is a through hole.

7. An evaporation apparatus, comprising the mask frame assembly of claim 1.

* * * * *